(12) United States Patent
Confalonieri et al.

(10) Patent No.: US 9,287,874 B2
(45) Date of Patent: Mar. 15, 2016

(54) LEVEL-SHIFTING DEVICE

(71) Applicant: ST-Ericsson SA, Plan-les-Ouates (CH)

(72) Inventors: Pierangelo Confalonieri, Monza e Brianza (IT); Federico Guanziroli, Monza e Brianza (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/655,353

(22) PCT Filed: Dec. 5, 2013

(86) PCT No.: PCT/EP2013/075715
§ 371 (c)(1),
(2) Date: Jun. 25, 2015

(87) PCT Pub. No.: WO2014/114399
PCT Pub. Date: Jul. 31, 2014

(65) Prior Publication Data
US 2015/0372680 A1      Dec. 24, 2015

Related U.S. Application Data

(60) Provisional application No. 61/760,372, filed on Feb. 4, 2013.

(30) Foreign Application Priority Data

Jan. 25, 2013   (EP) .................................... 13152777

(51) Int. Cl.
*H03K 19/0185*   (2006.01)
*H03K 19/00*     (2006.01)

(52) U.S. Cl.
CPC .... *H03K 19/018521* (2013.01); *H03K 19/0013* (2013.01)

(58) Field of Classification Search
CPC ............ H03K 3/012; H03K 19/00361; H03K 19/0175
USPC ................................................. 326/68, 80, 81
See application file for complete search history.

(56) References Cited

U.S. PATENT DOCUMENTS

| 5,969,542 | A  | * | 10/1999 | Maley .................... | H03K 3/012 326/17 |
| 6,049,228 | A  |   | 4/2000  | Moon | |
| 7,199,617 | B1 | * | 4/2007  | Schrom .......... | H03K 19/018528 326/68 |
| 7,839,171 | B1 | * | 11/2010 | Miles ..................... | H03K 3/011 326/63 |

(Continued)

OTHER PUBLICATIONS

International Search Report issued in corresponding International application No. PCT/EP20113/075715, date of mailing of the report Feb. 28, 2014.

(Continued)

*Primary Examiner* — Don Le
(74) *Attorney, Agent, or Firm* — Patent Portfolio Builders PLLC

(57) ABSTRACT

A voltage level shifting device for driving a capacitive load has an input terminal for receiving a first input signal switchable between a first logic state corresponding to a first reference voltage and a second logic state corresponding to a second reference voltage, and an output terminal for supplying an output signal switchable between a first logic state corresponding to a third reference voltage and a second logic state corresponding to a fourth reference voltage. The device also has a first electronic circuit that is activated following a commutation of the first input signal from the first reference voltage to the second reference voltage for fixing the output terminal to the fourth reference voltage. The device further has a second electronic circuit that is activated following a commutation of the first input signal from the second reference voltage to the first reference voltage.

15 Claims, 4 Drawing Sheets

(56) References Cited

U.S. PATENT DOCUMENTS

| | | | |
|---|---|---|---|
| 7,880,526 B2 * | 2/2011 | Acharya | H03K 3/356113 326/63 |
| 2010/0214000 A1 | 8/2010 | Crespi et al. | |

OTHER PUBLICATIONS

European Search Report issued in corresponding European application No. EP 13 15 2777, date of completion of the search Jun. 4, 2013.

Groeneweg, Willem H., "A Class-AB/D Audio Power Amplifier for Mobile Applications Integrated Into a 2.5G/3G Baseband Processor," IEEE Transactions on Circuits and Systems-I: Regular Papers, vol. 57, No. 5, May 5, 2010, DOI: 10.1109/TCSI.2010.2046954.

Maderbacher, Gerhard, et al., "Fast and Robust Level Shifters in 65 nm CMOS," 2011 Proceedings of the ESSCIRC, Sep. 12-16, 2011, Helsinki, Finland, pp. 195-198, ISBN: 978-1-4577-0704-9, DOI: 10.11091/ESSCIRC.2011.6044898.

* cited by examiner

LEVEL-SHIFTING DEVICE

TECHNICAL FIELD

The present disclosure relates to the field of electronic devices operating to shift voltage levels in electronic circuits and more particularly concerns a voltage level-shifting device.

BACKGROUND ART

As known, a level-shifter is a device configured to process a digital input signal having a swing comprised between the ground potential GND and a first supply voltage VDD1 to generate as output a corresponding digital signal having its swing comprised between the ground potential GND and a second supply voltage VDD2. Generally, such second supply voltage VDD2 is higher than the first supply voltage VDD1.

For example, the digital input signal of the level shifter may be a signal processed in a low-voltage portion of the circuit having its swing comprised between the ground potential GND and the first supply voltage VDD1=1.2V to reduce power dissipation. The output signal generated by the level shifter can drive a power buffer so that to commutate between the ground potential GND itself and the second supply voltage VDD2 corresponding to the battery voltage of a mobile phone, which is usually a time-varying voltage between 2.3V and 5V.

However, MOS transistors manufactured according to the most recent technologies, for example a 40 nm manufacturing process, would incur breakdowns or unacceptable degradations when used with voltages having a swing varying between the ground potential GND and the above mentioned battery voltage. In this case, known configurations of a level shifter from low voltage input swing to high voltage output swing cannot be used.

In order to overcome such inconvenience, particularly for driving an output P-channel MOS transistor, one solution is to use a level shifter configured to shift its input voltage having a swing comprised between the first supply voltage VDD1 and the ground potential GND to an output voltage having a swing from the second supply voltage VDD2 (corresponding to P-MOS switched-off) to VDD2-k (corresponding to P-MOS switched-on) which is suitable to drive the gate of the P-MOS. In this case, k indicates a voltage value that can be fixed so that to be compatible with reliability issues and acceptable overdrive. Values for k are, for example, comprised in the range 1.8V-2.2V.

To this end, a level shifter that can be employed is described in the article "A Class-AB/D Audio Power Amplifier for Mobile Applications Integrated into a 2.5G/3G Baseband Processor", by Willem H. Groeneweg et al., IEEE TRANSACTIONS ON CIRCUITS AND SYSTEMS—I: Regular Papers, vol. 57, No 5, May 2010. The structure of such level shifter is shown in FIG. 4 and indicated with the reference number 300.

Particularly, a first M3 and a second M4 N-MOS transistor of level shifter 300 have their gate terminals connected, respectively, to a first 301 and to a second 302 input of the level shifter 300. Such first input 301 is configured to receive a digital low-voltage input signal $V_A$ that can correspond to the ground potential GND or to the first supply voltage VDD1. The first input 301 of the level shifter 300 is connected to the second input 302 through an inverter 303, therefore the second input 302 of the level shifter 300 is configured to receive a first low-voltage input signal $V_M$ which is logically opposite to the low-voltage input signal $V_A$. In more detail, such first low-voltage input signal $V_M$ corresponds to the ground potential GND or to the first supply voltage VDD1 when the low-voltage input signal $V_A$ corresponds to the first supply voltage VDD1 or to the ground potential GND, respectively. In this way, the first M3 and second M4 transistors are alternatively switched on or off on the basis of the value assumed by the input signal $V_A$.

Moreover, the level shifter 300 comprises a current mirror including further N-MOS transistors $M_1$ and $M_2$ operating to mirror a first polarization current $I_g$ in a second polarization current $I_M$ applied to the source terminals of the first M3 and second M4 N-MOS transistors.

On the basis of the input signal $V_A$, the second polarization current $I_M$ can flow alternatively in a first branch and in a second branch of the level shifter 300. The first branch includes the first N-MOS transistor M3, a third N-MOS transistor M5, activated by a bias voltage VBIAS, and a first resistor R1 connected in series with them. The second branch includes the second N-MOS transistor M4, a fourth N-MOS transistor M6, activated by the same bias voltage VBIAS, and a second resistor R2 connected in series with them. Particularly, the first R1 and the second R2 resistor are connected between the second supply voltage VDD2 and, respectively, a first 304 and a second 305 output of the level shifter 300.

In view of the symmetrical structure of the known level shifter 300, the following conditions are valid for transistors and resistors: M3=M4, M5=M6, R1=R2.

In addition, the level shifter 300 comprises a first M7 and a second M8 P-MOS transistor where M7=M8. The first P-MOS transistor M7 is connected between the second supply voltage VDD2 and the first output 304 of the level shifter 300 and has its gate terminal connected to the second output 305 of the level shifter. The second P-MOS transistor M8 is connected between the second supply voltage VDD2 and the second output 305 and its gate terminal is connected to the first output 304 of the level shifter.

When the input signal $V_A$ corresponds to the first supply voltage VDD1, the second polarization current $I_M$ flows in the first branch of the level shifter 300 and generates over the first resistor R1 a voltage drop $R1I_M$ so that the voltage value on the first output 304 of the level shifter is VDD2−$R1I_M$. The second supply voltage VDD2 is connected to the second output 305 by the second P-MOS transistor M8 being switched on.

When the input signal $V_A$ corresponds to the ground potential GND, the second polarization current $I_M$ flows in the second branch of the level shifter 300 and generates over the second resistor R2 a voltage drop $R2I_M$ so that the voltage value on the second output 305 of the level shifter is VDD2−$R2I_M$. The second supply voltage VDD2 is connected to the first output 304 by the first P-MOS transistor M7 being switched on.

The level shifter 300 known in the art shows its limits when it is used to drive a large capacitive load $C_L$, for example a capacitive load of 2 pF. FIG. 5 shows time diagrams of the input signal $V_A$ and of output signal Vo related to the level shifter 300 of FIG. 4. Time diagram related to the output signal Vo is obtained assuming the second polarization current $I_M$=5 µA and R1=R2=360 kΩ. In fact, in this case the transition time of the output signal Vo generated by the level shifter 300 can reach a value, for example, of 1 µsec that is unacceptable for many applications.

It should be observed that, in the level shifter of FIG. 4, the fall time mainly depends on the values chosen for resistors R1=R2, on the capacitive load $C_L$ and on the second polarization current $I_M$. The rise time mainly depends on the values of capacitive load $C_L$ and on the resistors R1=R2. For example, for a capacitive load $C_L$=2 pF, to reduce both rise and fall times, the reduction of both resistors R1=R2 is required. In this case, in order to ensure that the low voltage value VDD2−R1$I_M$=VDD2−k of the output signal Vo is maintained compatible with reliability issues and acceptable overdrive as indicated above, the second polarization current $I_M$ should be increased.

In other words, to reduce the transition time with the solution for a level shifter 300 known in the art, the power consumption should be increased. This is often unacceptable.

SUMMARY OF THE INVENTION

It is an object of the present invention to provide a voltage level shifting device which ensures better performances in term of transition time than the existing solution by providing the same levels for output signal of the existing solution and without, substantially, increasing the power consumption.

The above object is reached by a voltage level shifting device according to independent claim 1.

Further embodiments of the invention are described in the dependent claims 2-13.

It is an object of the present invention to also provide an amplification device according to claim 14 comprising the voltage level shifting device of the invention, and a portable electronic equipment comprising such an amplification device according to claim 15.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

Figure 1:
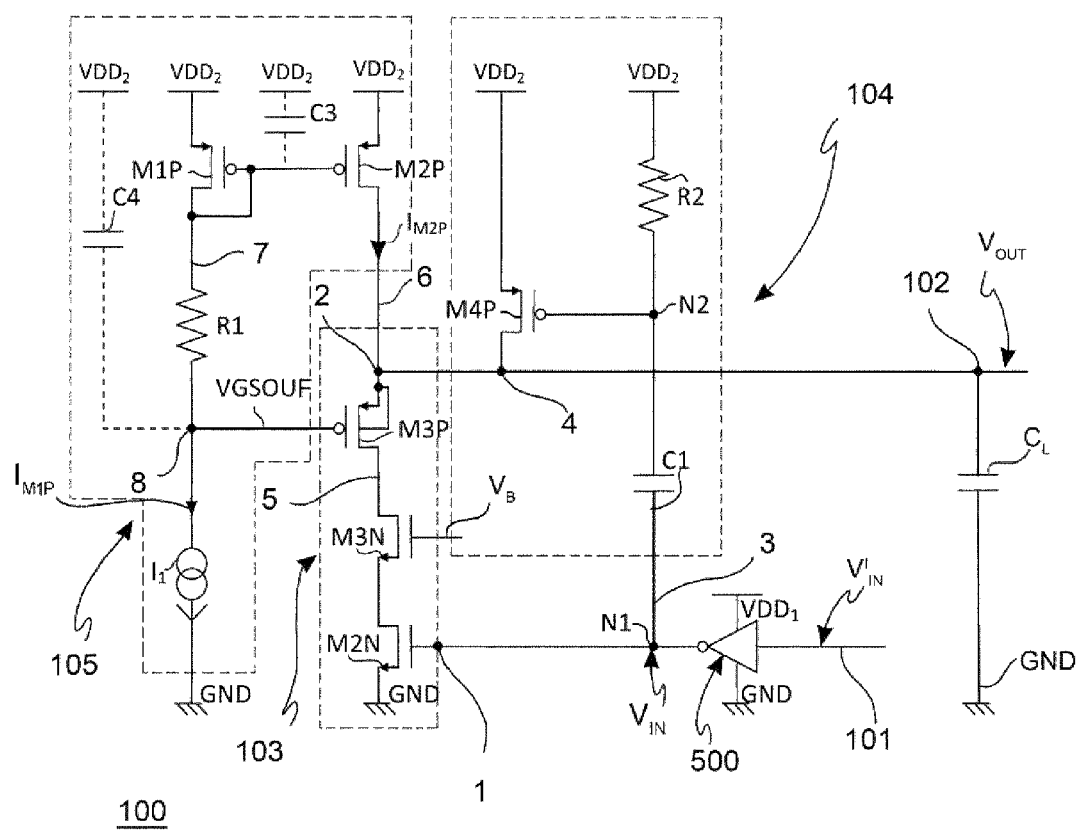
FIG. 1 shows a circuital structure of a first embodiment of a voltage level-shifting device in accordance with the invention.
Figure 2:
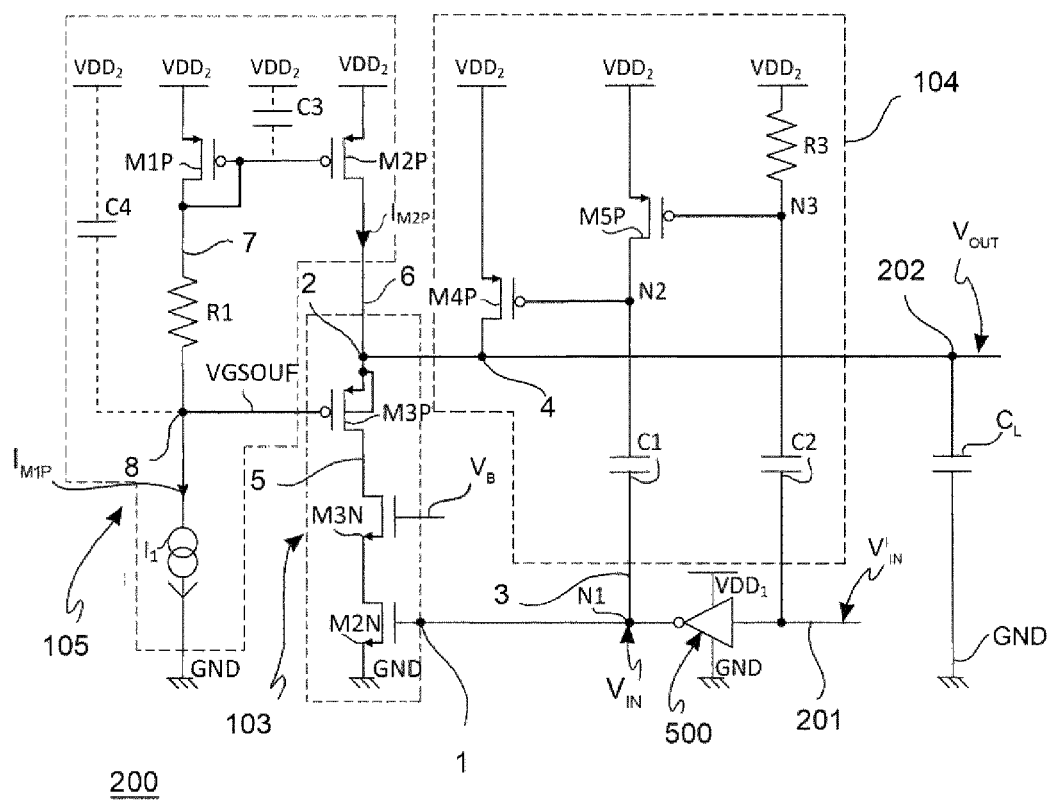
FIG. 2 shows a circuital structure of a second embodiment of the level-shifting device of the invention.

In the attached FIGS. 1 and 2 similar or identical elements are indicated using the same references.

With reference to FIG. 1, a circuital structure of a first embodiment of a voltage level-shifting device according to the present invention is indicated with the reference number 100. With reference to FIG. 2, a circuital structure of a second embodiment of the voltage level-shifting device of the present invention is indicated with the reference number 200. In the following the voltage level-shifting device 100,200 is also indicated level-shifting device or simply level-shifter.

Such level-shifting device 100,200 can be used in many electronic applications to drive a capacitive load $C_L$, for example a capacitive load of about 2 pF. The level-shifting device 100,200 of the invention can be advantageously used in portable communication apparatuses, such as for example mobile phones, smart-phones or tablets. Particularly, amplification devices, for example class-D amplifiers, included in such portable communication apparatuses can comprise the level-shifting device 100,200 of the invention.

With reference to both FIGS. 1 and 2, the voltage level-shifting device 100,200 comprises:

a first line set at a first reference voltage, such as the ground potential GND;

a second line set at a second reference voltage VDD1 greater than the first reference voltage GND; such second reference voltage corresponds to a first supply voltage, for example a voltage of 1.2V;

a third line set at a third reference voltage VDD2 greater than the second reference voltage VDD1. Such third reference voltage VDD2 corresponds to a second supply voltage, which can assume, for example, voltage values in the range 2.5V-5V.

The level-shifting device 100,200 comprises an input terminal N1 for receiving a first input signal $V_{IN}$ switchable between a first logic state corresponding to the first reference voltage GND and a second logic state corresponding to the second reference voltage VDD1.

The level-shifting device 100,200 further comprises an output terminal 102,202 for supplying an output signal $V_{OUT}$ to the capacitive load $C_L$ connected between such output terminal 102, 202 and the ground potential GND. In more detail, the output signal $V_{OUT}$ is switchable between a first logic state corresponding to the third reference voltage VDD2 and a second logic state corresponding to a fourth reference voltage VDD2−K obtained by reducing the third reference voltage VDD2 of a predetermined "operative" voltage K as will be explained in detail in the following. In this case, the operative voltage K represents a voltage value that can be fixed so that to be compatible with reliability issues. Values for K are, for example, comprised in the range 1.8V-2.2V.

In addition, the level-shifting device 100,200 comprises a first electronic circuit 103 having an input 1 connected to the input terminal N1 and an output 2 connected to the output terminal 102, 202. Particularly, the first electronic circuit 103 is activated following a commutation of the first input signal $V_{IN}$ from the first reference voltage GND to the second reference voltage VDD1 for fixing the output terminal 102,202 to the fourth reference voltage VDD2−K.

In an embodiment, the first electronic circuit 103 comprises an input circuit M2N,M3N and a source follower PMOS transistor M3P connected with them to form a branch between the output 2 and the first line GND.

Particularly, the source follower PMOS transistor M3P has its source terminal connected to the output 2 of the first electronic circuit 103 and its drain terminal connected to an output node 5 of the input circuit M2N,M3N. The gate terminal of the source follower PMOS transistor M3P is driven by a bias voltage VGSOUF.

In a preferred embodiment, the input circuit comprises a first M2N and a second M3N NMOS transistor connected together in a cascode configuration. Such first NMOS transistor M2N is activated following a commutation of the first input signal $V_{IN}$ from the first reference voltage GND to the second reference voltage VDD1 for fixing the source terminal of the source follower PMOS transistor M3P to the fourth reference voltage VDD2−K.

The second NMOS transistor M3N is maintained activated all the time by a reference voltage $V_B$ applied on its gate terminal. For example, a value for such reference voltage is about 2.5V. In addition, the source follower PMOS transistor M3P is maintained activated all the time by the bias voltage VGSOUF.

The level-shifting device 100,200 further comprises a second electronic circuit 104 having a first input 3 connected to the input terminal N1 above mentioned to receive the first input signal $V_{IN}$ and a first output 4 connected to the output terminal 102,202.

Particularly, the second electronic circuit 104 is activated following a commutation of the first input signal $V_{IN}$ from the second reference voltage VDD1 to the first reference voltage, i.e. the ground potential GND.

In more detail, the second electronic circuit 104 includes a circuital block M4P connected between the third line VDD2 and the first output 4. Such circuital block M4P is activated through a first input node N2 for commutating the output terminal 102, 202 from the fourth reference voltage VDD2–K to the third reference voltage VDD2 following the commutation of the first input signal $V_{IN}$ from the second reference voltage VDD1 to the first reference voltage GND.

In a preferred embodiment, such circuital block comprises a first PMOS transistor M4P connected between the third line VDD2 and the first output 4 of the second electronic circuit 104. The gate terminal of such first PMOS transistor M4P is connected to the first input node N2.

In addition, the second electronic circuit 104 includes a network R2, C1; C1, C2, R3, M5P operatively connected between the third line VDD2 and the first input 3 of the same circuit 104.

Advantageously, such network R2, C1; C1, C2, R3, M5P is configured to drive the first input node N2 to maintain the first PMOS transistor M4P activated at least for a first time interval T1 greater than a second time interval T2. Particularly, such second time interval T2 represents the time interval requested to commutate the output terminal 102, 202 of the level shifter 100,200 from the fourth reference voltage VDD2–K to the third reference voltage VDD2.

In greater detail, with reference to the level-shifting device 100 of FIG. 1, the network of the second electronic circuit 104 comprises:
- a first resistor R2 connected between the third line VDD2 and the first input node N2, and
- a first capacitor C1 connected between the same first input node N2 and the first input 3 of the second electronic circuit 104.

In addition, the level shifter 100 comprises a first input terminal 101 connected to the input terminal N1 trough an inverting circuit or inverter 500 which in turn is connected between the first line GND and the second line VDD1. Such inverter 500 is configured to provide at its output corresponding to the input terminal N1 the above mentioned first input signal $V_{IN}$ by logically inverting a second input signal $V_{IN}'$ received at its input corresponding to the first input terminal 101.

With reference to the level-shifting device 200 of FIG. 2, the network of the second electronic circuit 104 comprises:
- a first capacitor C1 connected between the first input node N2 and the first input 3 which is analogous to the first capacitor of level shifter 100;
- a second PMOS transistor M5P connected between the third line VDD2 and the first input node N2, and having its gate terminal connected to a second input node N3;
- a second resistor R3 connected between the third line VDD2 and the second input node N3;
- a second capacitor C2 connected between the second input node N3 and the first input terminal 201 of the level-shifter 200.

It should be observed that the level shifter 200 comprises a respective inverter 500 analogous to the inverter described with reference to the level shifter 100. Such inverter 500 is connected between the first input terminal 201 of the level-shifter 200 and the input terminal N1. Such first input terminal 201 is configured to receive the second input signal $V_{IN}'$ switchable between the first reference voltage GND and the second reference voltage VDD1 so that the first input signal $V_{IN}$ provided at the output of the inverter 500 is logically opposite to such second input signal $V_{IN}'$.

Furthermore, the voltage level-shifting device 100,200 comprises a bias circuit 105 connected between the third line VDD2 and the first line GND and configured to generate the above mentioned bias voltage VGSOUF. Such bias circuit 105 comprises a current mirror circuit or current mirror M1P, M2P having an output 6 connected to said output terminal 102, 202 to supply such output terminal with a current $I_{M2P}$ obtained by mirroring a first current $I_{M1P}$ generated by a current generator I1. Particularly, the current mirror circuit comprises a third M1P and a fourth M2P PMOS transistor. The gate and drain terminals of the third PMOS transistor M1P are connected together and to a gate terminal of the fourth PMOS transistor M2P. The source terminals of both third M1P and fourth M2P PMOS transistors are connected to the third line VDD2. The drain terminal of the fourth PMOS transistor M2P corresponds to the output 6 of the current mirror circuit and the drain terminal of the third PMOS transistor M1P corresponds to an input 7 of the same current mirror circuit. Such input 7 of the current mirror is connected to the first line GND through a first branch including a third resistor R1 series connected to the above mentioned current generator I1.

In more detail, the third resistor R1 is connected between the input 7 of the current mirror circuit M1P, M2P and an intermediate node 8 of the first branch. The bias circuit 105 can provide the bias voltage VGSOUF on the intermediate node 8 connected to the gate terminal of the source follower PMOS transistor M3P.

Optionally, the bias circuit 105 can comprise a third capacitor C4 connected between the third line VDD2 and said intermediate node 8. Further, the bias circuit 105 can, optionally, comprise a fourth capacitor C3 connected between the third line VDD2 and the input 7 of the current mirror circuit M1P, M2P.

Both the third C4 and the fourth C3 capacitor are used to reduce the disturbances at the gate terminal of the third PMOS transistor M1P and at the intermediate node 8. Such disturbances are mainly due to capacitances associated during commutations to the fourth PMOS transistor M2P and to the source follower M3P.

It should be observed that the bias voltage VGSOUF generated by the bias circuit 105 is obtained by subtracting to the third reference voltage VDD2 both a voltage threshold $V_{TH}$ typical of a PMOS transistor, in this case the voltage threshold $V_{TH}$ of the third PMOS M1P, and a voltage drop produced on the third resistor R1 by the bias current supplied by the current generator I1. Therefore, the bias voltage VGSOUF can be obtained with the equation:

$$VGSOUF = VDD2 - V_{TH} - R1I1 \quad (1)$$

In view of this, the voltage at the output terminal 102, 202 of the level-shifting device 100,200, particularly the fourth reference voltage VDD2–K which corresponds to the second logic state of the output signal $V_{OUT}$, can be obtained starting from equation (1) as:

$$VGSOUF + V_{TH} = VDD2 - R1I1 = VDD2 - K \quad (2)$$

Therefore, the voltage drop R1I1 on the third resistor R1 corresponds to the above mentioned predetermined operative voltage K.

It should be noted that the first current $I_{M1P}$ provided by current generator I1 is generally obtained as Vref/R, wherein Vref is a furnished precise voltage and R is a resistor of the same type of the third resistor R1, i.e. manufactured during the same process. In this way, the operative voltage K=R1I1= (Vref/R)R1 is a constant even if the third resistor R1 (and R) is varying with the process.

A way of operating for both embodiments 100, 200 of a voltage level-shifting device in accordance with the invention can be described with reference to FIGS. 1, 2, 3A and 3B. Particularly, the way of operating of both level shifters 100 and 200 is examined when the first input signal $V_{IN}$ commutates from the first reference voltage GND to the second reference voltage VDD1 (commutation low-to-high) and vice-versa when the same first input signal $V_{IN}$ commutates from the second reference voltage VDD1 to the first reference voltage GND (commutation high-to-low).

In the following of the description, the word "commutation" between voltage levels is used with the meaning of "switching".

Particularly, for both level shifters 100 and 200, when the second input signal $V_{IN}'$ falls to the first reference voltage, i.e. the ground potential GND, the first input signal $V_{IN}$ at the input terminal N1 rises to the second reference voltage, i.e. the first supply voltage VDD1. In this case, the voltage at the first input node N2 is incremented of almost the same first supply voltage VDD1 through the first capacitor C1 so that the first PMOS transistor M4P is maintained switched off.

Therefore, during a commutation from low-to-high of the first input signal $V_{IN}$, the second electronic circuit 104 of both level shifters 100, 200 is disabled, i.e. it does not contribute to determine the voltage at the output terminal 102, 202.

During the same commutation of the first input signal $V_{IN}$ from low-to-high, on the contrary, the first electronic circuit 103 is enabled, i.e. it contributes to determine the voltage at the output terminal 102,202. In fact, the first NMOS transistor M2N is on and it can start, through the branch including the second NMOS transistor M3N and the source follower PMOS transistor M3P, the falling edge of the output signal $V_{OUT}$. Particularly, a commutation of such output signal $V_{OUT}$ is caused from the third reference voltage, i.e. the second supply voltage VDD2, reached at the end of the previous commutation, to the fourth reference voltage VDD2-K forced by the source follower PMOS transistor M3P and indicated in equation (2) above. The fourth reference voltage corresponds to the low level of the output signal $V_{OUT}$.

It should be observed that the source follower PMOS transistor M3P is driven by the bias voltage VGSOUF. Particularly, the bias voltage VGSOUF forces the output terminal 102, 202 to VGSOUF+$V_{TH}$ as DC value, when the input terminal N1 is stable at high level. In this condition, the DC current is the current mirrored by the fourth transistor M2P.

During commutation of the output terminal 102,202 from high level to low level (N1 goes from low to high), at the beginning, the source follower PMOS M3P has a large overdrive (output 2 starts from the second supply voltage VDD2) and its conductance is very high. Therefore, the current flowing is much more high then the mirrored one $I_{M2P}$. This effect largely reduces an edge time of the output terminal 102, 202 during commutation from high to low.

With reference to the level shifter 100 shown in FIG. 1, when the second input signal $V_{IN}'$ rises from the ground potential GND to the second reference voltage VDD1, the first input signal $V_{IN}$ at the input terminal N1 falls to the ground potential GND switching off the first NMOS transistor M2N of the first electronic circuit 103. Therefore, during a commutation from high-to-low of the first input signal $V_{IN}$, the first electronic circuit 103 of the level shifter 100 is disabled, i.e. it does not contribute to determine the voltage at the output terminal 102. The above consideration is also valid for the level shifter 200 shown in FIG. 2 including the same first electronic circuit 103.

During such commutation, the voltage at the first input node N2 goes down towards the first reference voltage GND through the first capacitor C1 so that the first PMOS transistor M4P is switched on.

In this way, the output terminal 102 of the level shifter 100 is forced to the third reference voltage VDD2. Particularly, the output terminal 102 commutates from the fourth reference voltage VDD2-K, previously reached, to the third reference voltage VDD2 in a commutation time corresponding to the second time interval T2 mentioned above.

It should be observed that, in the level shifter 100, after the commutation of the first input node N2 from high to low has occurred, the network comprising the first capacitor C1 and the first resistor R2 is configured to drive such node N2 so that it is raised again towards the third reference voltage VDD2 with an exponential time trend governed by a time constant $\tau$=R2*C1. Therefore, the first PMOS transistor M4P is, substantially, again switched off when the voltage at the first input node N2 exceeds a VDD2-$V_{TH}$ value, moving with the exponential law from the starting value to the third reference voltage VDD2.

In the level shifter 100 of FIG. 1, some conditions have to be respected to guarantee the correct circuital behavior. In fact, the Applicant has verified through simulations results that the level shifter 100 works properly if, for the second input signal $V_{IN}'$, a falling edge is not too close to a subsequent rising edge. Such results can be described with reference to FIG. 3A.

In more detail, assuming that the first input signal $V_{IN}$ stays low (the second input signal $V_{IN}'$ is high) for long time, the first input node N2 has enough time to reach the third reference voltage VDD2, in accordance with the time constant $\tau$=R2*C1.

However, when the first input signal $V_{IN}$ rises again (the second input signal $V_{IN}'$ falls), the voltage value on the first input node N2 rises, in a first phase, over the third reference voltage VDD2, and then decreases asymptotically to the third reference voltage VDD2 in a second phase in accordance with the time constant $\tau$. However, if not enough time elapses before the next falling edge of the first input signal $V_{IN}$, i.e, the rising edge of the second input signal $V_{IN}'$ is after about 0.01 μsec, the voltage reached by the first input node N2 is far from the third reference voltage VDD2 and the voltage drop caused on the input node N2 in consequence of such falling is not enough to switch the first PMOS transistor M4P on. M4P stays off or is maintained "not properly on". In more detail, the condition with first PMOS transistor M4P maintained "not properly on" corresponds to the circuital situation in which the input node N2 goes to a voltage that should provide the PMOS transistor M4P with the on state, but with an insufficient overdrive to allow fast commutation of the output signal $V_{OUT}$.

Figure 3A:
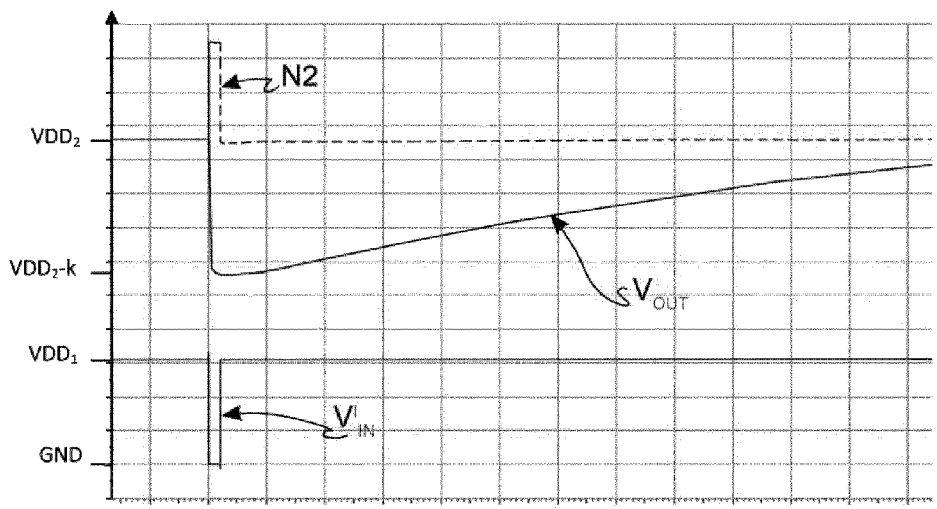
FIG. 3A-3B show time diagrams of signals related to the level shifting devices of FIGS. 1 and 2, respectively.

FIG. 3A shows time diagrams of the second input signal $V_{IN}'$, of the voltage on the input node N2 and of the output signal $V_{OUT}$. As can be seen, if the first PMOS transistor M4P is maintained off or not properly on, the rising edge of the output signal $V_{OUT}$ results very slow, e.g. up to 1000 times slower if compared with the operative condition in which the PMOS transistor M4P is on, because only the mirrored current $I_{M2P}$ can charge the capacitive load $C_L$ to ramp up the output terminal 102 to the third reference voltage VDD2. Unfortunately, such mirrored current is a small current, for example of about 5 μA to reduce the power consumption of the level shifter 100.

The second embodiment of the level shifter 200 of the invention is configured to overcome also the limit described above with reference to the level shifter 100 by introducing a modification in the circuital structure of the level shifter 100.

In fact when the input node N2 goes over the third reference voltage VDD2 (as consequence of the rising edge of the first input signal $V_{IN}$), the second input node N3 goes down and it switches the second PMOS transistor M5P on. With such second PMOS transistor M5P activated, the first input node N2 is set quickly to the third reference voltage VDD2. In this case, a first time constant is $\tau'=C1*RonM5P$, wherein RonM5P represents the resistance offered by the second PMOS transistor M5P, which is dimensioned as a switch, in its active state which is lower than the first resistor R2 and therefore $\tau'<\tau$.

Figure 3B:
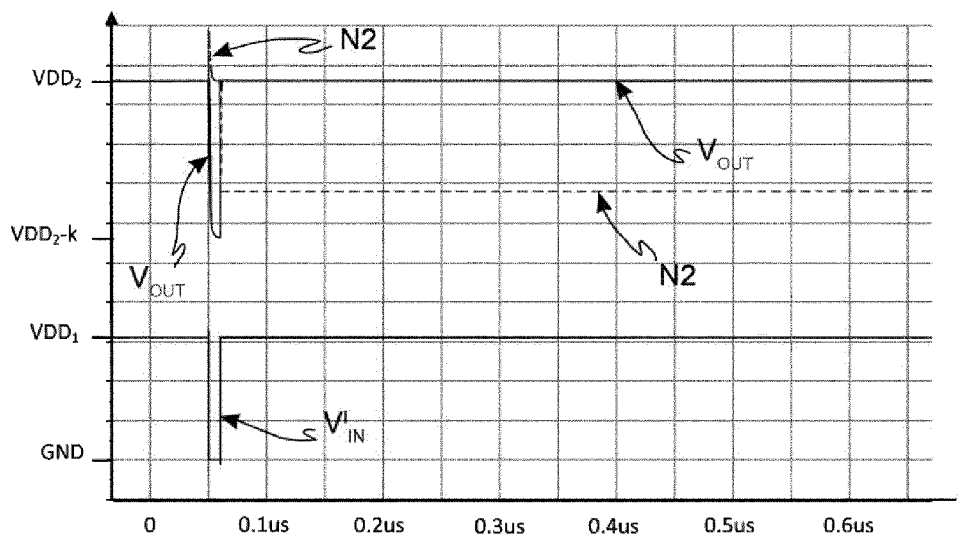

In more detail, with reference to FIG. 3B, the level shifter 200 ensures that the first input node N2 is already set to the third reference voltage VDD2 before the commutation low-to-high of the second input signal $V_{IN}'$. In this way, the rising edge of the output signal $V_{OUT}$ is faster. Differently from the level shifter of FIG. 1, the level shifter 200 can maintain the first PMOS transistor M4P on for all the time of the first input signal $V_{IN}$ is low. This can be further advantageous because the output terminal remains at low impedance for all this time. The reason is that when the first input terminal 201 rises (before of input node N1 falling edge), the second input node N3 rises (to VDD2 or more) and the second PMOS transistor M5P stays off for all the time. Therefore, the first input node N2 stays low and its node impedance is almost infinite.

Figure 4:
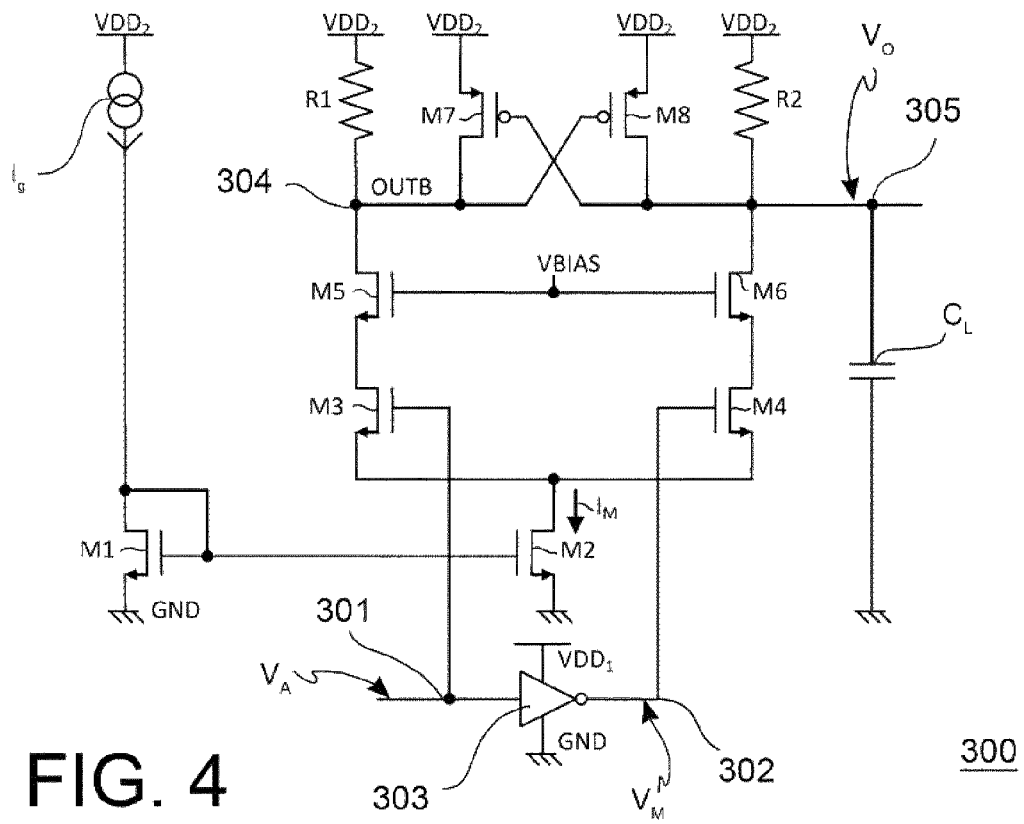
FIG. 4 shows a circuital structure of a level shifter known in the art.
Figure 5:
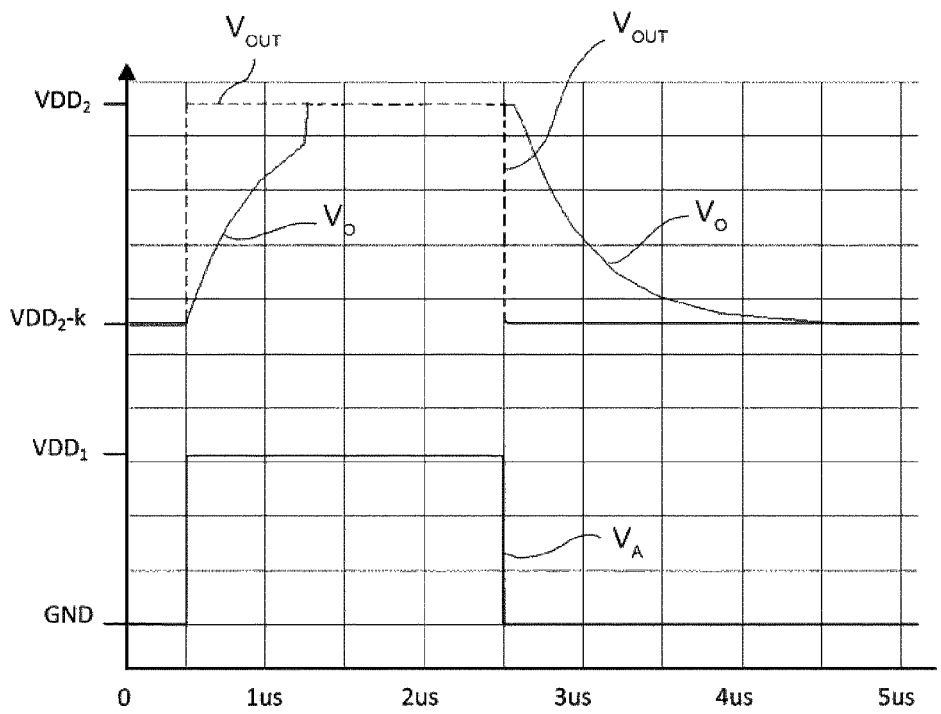
FIG. 5 shows time diagrams of input and output signals of the level shifters of FIGS. 1, 2 and 4.

Assuming that the current provided by the generator I1 of the level shifters 100 and 200, substantially, corresponds to the current $I_M$ of the level shifter 300 known in the art and shown in FIG. 4, and that the capacitive load $C_L$ to be driven is the same, about 2 pF, the level shifters 100, 200 of the present invention provides the same levels for the output signal $V_{OUT}$ but an output transition time much faster than the solution of the prior art. This advantage of level shifters 100, 200 of the present invention can be appreciated with reference to FIG. 5 which shows a time diagram of the output signal $V_{OUT}$ of level shifters 100,200, in broken line, compared to the output signal Vo provided by the prior art circuit 300 as response to the same input signal. Particularly, such result is obtained by assuming that the second input signal $V_{IN}'$ of FIGS. 1 and 2 corresponds to the input signal $V_A$ of FIG. 4. This output transition time for level shifters 100, 200 is about 1 ns.

The level shifters 100, 200 of the present invention offer low impedance of the output terminal 102,202 during transitions, maintaining DC compatibility. In fact, during falling edge of the second input signal $V_{IN}'$, the first M2N and second M3P NMOS transistors ensure output low impedance. During the rising edge of the second input signal $V_{IN}'$, the first PMOS transistor M4P guarantees low impedance for at least the first time interval T1.

It should be observed that the second NMOS transistor M3N is used to guarantee the reliability of the level shifter 100, 200 in order to avoid that an excessive overvoltage is applied between the drain and source terminals of the first NMOS transistor M2N.

In addition, in a further embodiment, the first resistor R2 of level shifter 100 could be replaced by a MOS transistor. Moreover, the second resistor R3 of level shifter 200 could be replaced by a MOS transistor.

From the point of view of a correct operation of the level shifter 100, the capacitance value of the first capacitor C1 has to be greater than the gate capacitance of the first PMOS transistor M4P, in order to transfer on the first input node N2 enough part of the signal swing at the input terminal N1 and, therefore, to control the first PMOS transistor M4P with a proper overdrive.

In addition, the first resistor R2 has to be chosen big enough to maintain the first PMOS transistor M4P on at least for the first time interval T1 that is greater than the second time interval T2 requested to commutate the output terminal 102 from the fourth reference voltage VDD2−K to the third reference voltage VDD2. At the same time, the first resistor R2 has to be chosen small enough to guarantee that, after a rising edge of the input terminal N1, the first input node N2 reaches a voltage close to the third reference voltage VDD2 before a next input falling edge is applied to the input terminal N1.

Regarding the embodiments of the voltage level shifting device described above, a person skilled in the art, in order to satisfy contingent needs, can make modifications, adaptations and substitutions of elements with other functional equivalent elements, without departing from the scope of the following claims. Each of the features described as belonging to a possible embodiment can be made independent of the other described embodiments.

The invention claimed is:

1. A voltage level shifting device for driving a capacitive load, the voltage level shifting device comprising:
   a first line set at a first reference voltage;
   a second line set at a second reference voltage greater than the first reference voltage;
   a third line set at a third reference voltage greater than the second reference voltage;
   an input terminal for receiving a first input signal switchable between a first input logic state corresponding to said first reference voltage and a second input logic state corresponding to said second reference voltage;
   an output terminal for supplying an output signal switchable between a first output logic state corresponding to said third reference voltage and a second output logic state corresponding to a fourth reference voltage obtained by reducing said third reference voltage by predetermined operative voltage;
   a first electronic circuit having an input connected to the input terminal and an output connected to the output terminal, said first electronic circuit being activated following a commutation of the first input signal from the first reference voltage to the second reference voltage for fixing the output terminal to the fourth reference voltage;
   a second electronic circuit having a first input connected to the input terminal to receive the first input signal and a first output connected to the output terminal, said second electronic circuit being activated following a commutation of the first input signal from the second reference voltage to the first reference voltage, the second electronic circuit including:
   a circuital block connected between the third line and the first output, said circuital block being activated through a first input node for commutating the output terminal from the fourth reference voltage to the third reference voltage following said commutation of the first input signal from the second reference voltage to the first reference voltage, and
   a network operatively connected between the third line and the first input, configured to drive said first input node to maintain said circuital block activated at least for a first time interval greater than a second time interval requested to commutate said output terminal from the fourth reference voltage to the third reference voltage.

2. The voltage level shifting device according to claim 1, wherein said circuital block comprises a first PMOS transistor connected between the third line and the first output and having a gate terminal connected to said first input node.

3. The voltage level shifting device according to claim 1, wherein said network of the second electronic circuit comprises:
- a first resistor connected between the third line and said first input node, and
- a first capacitor connected between the same first input node and said first input.

4. The voltage level shifting device according to claim 1, wherein said network of the second electronic circuit comprises:
- a first capacitor connected between the first input node and said first input;
- a second PMOS transistor connected between the third line and said first input node and having a gate terminal connected to a second input node;
- a second resistor connected between the third line and the second input node;
    - a second capacitor connected between said second input node and a first input terminal of the device configured to receive a second input signal switchable between the first reference voltage and the second reference voltage so that the second input signal is logically opposite to said first input signal.

5. The voltage level shifting device according to claim 1, wherein said first electronic circuit comprises an input circuit and a source follower PMOS transistor connected to the input circuit to form a branch between the output and the first line.

6. The voltage level shifting device according to claim 5, wherein said source follower PMOS transistor has a source terminal connected to the output and a drain terminal connected to an output node of the input circuit, a gate terminal of the source follower PMOS transistor being driven by a bias voltage.

7. The voltage level shifting device according to claim 6, wherein said input circuit comprises a first and a second NMOS transistor connected together in a cascode configuration, said first NMOS transistor being activated following a commutation of the first input signal from the first reference voltage to the second reference voltage for fixing the source terminal of the source follower PMOS transistor to the fourth reference voltage.

8. The voltage level shifting device according to claim 6, further comprising a bias circuit configured to generate said bias voltage and connected between the third line and the first line, said bias circuit including:
- a current mirror circuit having an output connected to said output terminal to supply said output terminal with a mirrored current generated by a current generator;
- a first branch connected between the first line and an input of said current mirror circuit, said first branch including a third resistor series connected to said current generator.

9. The voltage level shifting device according to claim 8, wherein said third resistor is connected between the input of the current mirror circuit and an intermediate node of the first branch so that the bias circuit provides said bias voltage on said intermediate node connected to the gate terminal of the source follower PMOS transistor.

10. A voltage level shifting device according to claim 9, wherein said bias circuit comprises a third capacitor connected between the third line and said intermediate node.

11. The voltage level shifting device according to claim 9, wherein said bias circuit further comprises a fourth capacitor connected between the third line and the input of the current mirror circuit.

12. The voltage level shifting device according to claim 8, wherein said bias voltage is obtained by subtracting from said third reference voltage both a voltage threshold of a PMOS transistor and a voltage drop produced on said third resistor, according to:

$$VGSOUF = VDD2 - V_{TH} - R1\,I1$$

in which I1 represents a bias current generated by the current generator.

13. The voltage level shifting device according to claim 12, wherein the second logic state of the output signal corresponding to said fourth reference voltage is obtained as based on:

$$VGSOUF + V_{TH} = VDD2 - R1I1 = VDD2 - K$$

in which:
VGSOUF is said bias voltage;
VDD2 is said third reference voltage;
$V_{TH}$ is a voltage threshold of a PMOS transistor; and
R1I1 =K is a voltage drop on the third resistor corresponding to the predetermined operative voltage.

14. An amplification device comprising a voltage level shifting device including:
- a first line set at a first reference voltage;
- a second line set at a second reference voltage greater than the first reference voltage;
- a third line set at a third reference voltage greater than the second reference voltage;
- an input terminal for receiving a first input signal switchable between a first input logic state corresponding to said first reference voltage and a second input logic state corresponding to said second reference voltage;
- an output terminal for supplying an output signal switchable between a first output logic state corresponding to said third reference voltage and a second output logic state corresponding to a fourth reference voltage obtained by reducing said third reference voltage by a predetermined operative voltage;
- a first electronic circuit having an input connected to the input terminal and an output connected to the output terminal, said first electronic circuit being activated following a commutation of the first input signal from the first reference voltage to the second reference voltage for fixing the output terminal to the fourth reference voltage;
- a second electronic circuit having a first input connected to the input terminal to receive the first input signal and a first output connected to the output terminal, said second electronic circuit being activated following a commutation of the first input signal from the second reference voltage to the first reference voltage, the second electronic circuit including:
    - a circuital block connected between the third line and the first output, said circuital block being activated through a first input node for commutating the output terminal from the fourth reference voltage to the third reference voltage following said commutation of the first input signal from the second reference voltage to the first reference voltage, and
    - a network operatively connected between the third line and the first input, configured to drive said first input node to maintain said circuital block activated at least for a first time interval greater than a second time interval requested to commutate said output terminal from the fourth reference voltage to the third reference voltage.

15. A portable electronic equipment comprising the amplification device having a voltage level shifting device including:
a first line set at a first reference voltage;
a second line set at a second reference voltage greater than the first reference voltage;
a third line set at a third reference voltage greater than the second reference voltage;
an input terminal for receiving a first input signal switchable between a first input logic state corresponding to said first reference voltage and a second input logic state corresponding to said second reference voltage;
an output terminal for supplying an output signal switchable between a first output logic state corresponding to said third reference voltage and a second output logic state corresponding to a fourth reference voltage obtained by reducing said third reference voltage by a predetermined operative voltage;
a first electronic circuit having an input connected to the input terminal and an output connected to the output terminal, said first electronic circuit being activated following a commutation of the first input signal from the first reference voltage to the second reference voltage for fixing the output terminal to the fourth reference voltage;
a second electronic circuit having a first input connected to the input terminal to receive the first input signal and a first output connected to the output terminal, said second electronic circuit being activated following a commutation of the first input signal from the second reference voltage to the first reference voltage, the second electronic circuit including:
a circuital block connected between the third line and the first output, said circuital block being activated through a first input node for commutating the output terminal from the fourth reference voltage to the third reference voltage following said commutation of the first input signal from the second reference voltage to the first reference voltage, and
a network operatively connected between the third line and the first input, configured to drive said first input node to maintain said circuital block activated at least for a first time interval greater than a second time interval requested to commutate said output terminal from the fourth reference voltage to the third reference voltage.

* * * * *